(12) United States Patent
Yu

(10) Patent No.: US 6,387,819 B1
(45) Date of Patent: May 14, 2002

(54) METHOD FOR ETCHING LOW K DIELECTRIC LAYERS

(75) Inventor: Min Yu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/069,568

(22) Filed: Apr. 29, 1998

(51) Int. Cl.$^7$ .......................... H01L 21/302; B44C 1/22
(52) U.S. Cl. ..................... 438/725; 216/67; 216/41; 216/51
(58) Field of Search ................ 216/67, 41, 51; 438/725

(56) References Cited

U.S. PATENT DOCUMENTS

| | | | |
|---|---|---|---|
| 4,357,203 A | * 11/1982 | Zelez | 438/623 |
| 4,473,437 A | 9/1984 | Higashikawa et al. | 156/643 |
| 4,983,254 A | * 1/1991 | Fujimura et al. | 216/67 |
| 5,100,501 A | * 3/1992 | Blumenthal et al. | 216/67 |
| 5,110,712 A | * 5/1992 | Kessler et al. | 438/623 |
| 5,262,279 A | 11/1993 | Tsang et al. | 430/311 |
| 5,486,493 A | * 1/1996 | Jeng | 438/623 |
| 5,545,289 A | * 8/1996 | Chen et al. | 438/694 |
| 5,559,055 A | 9/1996 | Chang et al. | 438/586 |
| 5,591,677 A | 1/1997 | Jeng | 438/623 |
| 5,660,738 A | 8/1997 | Hunter, Jr. et al. | 216/17 |
| 5,679,608 A | 10/1997 | Cheung et al. | 437/195 |
| 5,895,742 A | * 4/1999 | Lin | 430/321 |
| 6,077,792 A | * 6/2000 | Farrar | 438/780 |

OTHER PUBLICATIONS

Standaert et al., :High–Density Plasma Etching of Low Dielectric Constant Material, pp. 265–275, Mat.Res.Soc..Symp. Proc., vol. 511, 1998 Material Research Society, 1998.*

Peters, Laura, Pursuing the Perfect Low–k Dielectric, Sep. 1998, Semiconductor International, pp. 1–11.

(List continued on next page.)

Primary Examiner—Randy Gulakowski
Assistant Examiner—Shamim Ahmed
(74) Attorney, Agent, or Firm—Janah & Associates

(57) ABSTRACT

A method of etching an organic dielectric layer 10 on a substrate 15 with a high etching rate and a high etching selectivity ratio. The organic dielectric layer 10 comprises a low k dielectric material, such as a silicon-containing organic polymer, for example, benzocyclobutene. A patterned mask layer is formed on the organic dielectric layer 10, and the substrate 15 is placed in a process zone 35 of a process chamber 30. An energized process gas introduced into the process zone 35, comprises an oxygen-containing gas for etching the organic dielectric layer 10, a non-reactive gas for removing dissociated material to enhance the etching rate, and optionally, passivating gas for forming passivating deposits on sidewalls 90 of freshly etched features to promote anisotropic etching. Preferably, during etching, the temperature of substrate 15 is maintained at a low temperature of from about 15° C. of 80° C. to enhance the rate of etching of the dielectric layer. The etching method is particularly useful for forming interconnect plugs in vias 100 etched through the organic dielectric layer 10 by a dual damascene process.

52 Claims, 6 Drawing Sheets

OTHER PUBLICATIONS

PCT International Search Report Dated Nov. 26, 1999.
PCT International Search Report Dated Aug. 20, 1999.
Shimokawa, et al., "Fast and Extremely Selective Polyimide Etching with a Magnetically Controlled Reactive Ion Etching System", pp. 192–197, NTT Applied Electronics Laboratories, Nippon Telegraph and Telephone Corporation, Musashino–shi, Tokyo 180, Japan.
Juan et al., "High Aspect Ratio Polyimide Etching Using an Oxygen Plasma Generated by Electron Cyclotron Resonance Source", pp. 422–426, Solid State Electronics Laboratory, Department of Electrical Engineering and Computer Science, The University of Michigan, Ann Arbor, Michigan, Received Aug. 6, 1993, Accepted Sep. 21, 1993.

Proceedings IEEE, "Micro Electro Mechanical Systems an Investigation of Micro Structures, Sensors, Actuators, Machines and Robots", Sponsored by the IEEE Robotics and Automation Society and in Cooperation with the IEE of Japan and the ASME Dynamic Systems and Control Division, 1991, Nara, Japan, Jan. 30–Feb. 2, 1991.

* cited by examiner

METHOD FOR ETCHING LOW K DIELECTRIC LAYERS

BACKGROUND

The present invention relates to a process for etching dielectric layers on a substrate.

Dielectric material, such as silicon dioxide, silicon nitride, or TEOS deposited glass, is used in integrated circuits to electrically isolate active devices or features formed on a semiconductor substrate. For example, a layer of dielectric material can be used to electrically isolate electrically conductive interconnect lines that electrically connect active devices on the substrate. It is often necessary to etch through these dielectric layers to form holes or "vias" into which conducting material is deposited to make vertical interconnection or "contact plugs." To etch the dielectric layer, a mask layer of an etch-resistant material is deposited on the dielectric layer and patterned using conventional photolithographic methods to conform to a desired pattern of holes. In conventional etching processes, the dielectric layer is typically etched in a process chamber using a plasma of etchant gases. For example, a silicon dioxide layer is etched by a plasma of fluorine-containing gas that reacts with silicon in the dielectric layer to form volatile $SiF_x$ species. Suitable fluorine-containing gases include, for example, $CHF_3$, $CH_3F$, $CF_4$, and $CH_2F_2$. In addition, the etchant gas contains passivating gases that combine with other vaporized gaseous species to form passivating deposits on the freshly etched features to provide anisotropic etching of the features.

The demand for faster integrated circuits in recent years has produced higher circuit densities and operating frequencies or clock speeds, resulting in the need for dielectric materials having a low dielectric constant (low K); i.e., in current semiconductor fabrication terminology, a low K material is a material that has a dielectric constant of less than about 3.2 which is the dielectric constant of silicon oxide, and more preferably from about 2.5 to 3.2. In high density integrated circuits, the metal interconnect lines are positioned closer together and carry voltages at higher frequencies. The relatively high dielectric constants of conventional dielectric materials allow polarization of the dielectric layer and crosstalk between the interconnect lines. Thus materials having low K are necessary to reduce capacitive coupling between interconnect lines in order to use the highest possible operating frequencies. New low K dielectric materials typically comprise organic polymers such as benzocyclobutene, parylene, polytetrafluoroethylene, polyether, or polyimide. In addition, low K dielectric materials often include small amounts of other materials, such as elemental silicon or silicon-containing compounds, for example Si, $SiO_2$, or $Si_3N_4$ to provide increased thermal stability and adhesion to a variety of metals and oxides.

As with the silicon oxide materials, the low K dielectric materials are also etched using a plasma of a fluorine-containing gas, especially low K dielectric materials which contain silicon, such as benzocyclobutene, because the fluorine plasma readily reacts with the silicon-containing dielectric. However, it is difficult for the fluorine-containing gas compositions to provide both a high etch rate and a high etching selectivity ratio. By etching selectivity ratio it is meant the ratio of the rate of etching of the low K dielectric layer to the rate of etching of the overlying mask layer (which is typically silicon dioxide), or an underlying silicon-containing layer, such as silicon, polysilicon layer, or titanium silicide. Tailoring the gas composition to provide a high etch-rate often results in a low etching selectivity ratio, and vice versa. Modern integrated circuits typically require etching selectivity ratios of greater than 5:1 with respect to the mask layer, and 15:1 or greater with respect to adjacent and underlying silicon-containing layers such as polysilicon, $WSi_x$, and $TiSi_x$. The low selectivity ratio of conventional etching techniques, using fluorine-containing gases, make it especially difficult to anisotropically etch features having high aspect ratios, such as vias, in low K dielectric layers. Furthermore, fluorine-containing gases erode the process chamber, for example, highly reactive atomic fluorine species react with aluminum in process chambers to form volatile aluminum fluoride species, such as $AlF_x$. Thus it is desirable to have an etching process for etching low dielectric materials that is absent fluorine and that provides high etch rates and a high etching selectivity ratio.

Another problem with conventional processes for etching low K dielectric material is that the etching processes fail to maintain the critical dimensions of etched features, which are the predefined dimensions of the etched features used to determine their electrical properties in the design of integrated circuits. In modern integrated circuits, the line widths of interconnect lines and diameters of contact plugs are becoming increasingly smaller to levels below 0.25 microns, to accommodate higher circuit densities. Because the electrical resistance of these features is proportional to the cross-sectional area of the etched features, it is important to maintain consistent and uniform dimensions without variations across an etched feature or between different etched features. Tapering cross-sectional profiles, that vary as a function of the spacing between the features or other variations in the profile of the features, are not acceptable. The critical dimensions are typically measured as a ratio or difference between the width $W_r$ of the mask or resist features and the width $W_e$ of the resultant etched features. The closer the two widths, the more predictable and reliable are the electrical properties of the etched features.

Another problem with conventional etching processes arises from excessive deposition of the passivating or other etchant deposits on the etched features or holes in the dielectric layer. These passivating deposits must be removed prior to filling the etched holes with electrically conductive material. While the precise composition of the passivating deposits depends upon the vaporized species in the process gas, the material being etched, and the mask or resist layer applied on the substrate, the passivating deposits typically consist of polymeric material. Because of their chemical composition, the passivating deposits are often difficult to remove without further etching or damaging the low K dielectric material. Thus it is desirable to have an etching process for etching a low K dielectric material that removes the passivating deposits while etching the substrate.

Yet another problem arises because it is difficult to form interconnect lines and vias in a low K dielectric layer by conventional processes, such as for example, a dual damascene method. A dual damascene process is a multilevel interconnect fabrication process in which a dielectric layer is etched to form first voids for fabricating vias that connect different levels of interconnecting lines, and second voids to fabricate interconnect lines. After the first voids are etched, the voids are filled with a sacrificial material, such as a photoresist comprising an organic polymer, which is resistant to the etchant gas. Then, the dielectric layer is etched a second time to form second voids for the interconnect lines which overlie the first voids. Thereafter, the sacrificial material is removed from the first voids, by dipping the substrate in an etchant solution. The first and second voids for the vias and lines are filled with metal in a single metallization step. However, when a low K dielectric material is used for the dielectric layer, it is difficult to use conventional dual damascene techniques because the same etchant solution that removes the sacrificial material will also often remove the low K dielectric material because both materials are organic polymers.

Accordingly, there is a need for an etching process for anisotropically etching low K dielectric material that provides a high etching rate and etching selectivity ratio relative to the overlying mask layer or underlying silicon-containing layer. It is desirable for the etching process to leave little or no passivating deposits on the substrate after etching is completed. It is also desirable that the etching plasma be absent fluorine-containing gas which erodes the process chamber. There is a further need for a process for forming low K dielectrics layers by a conventional dual damascene process.

SUMMARY

This invention provides a method for etching a dielectric layer on a substrate, such as a silicon-containing organic dielectric layer, to provide a high etching selectivity to an overlying mask. The method comprises the steps of (i) placing a substrate having a dielectric layer covered by a mask of silicon oxide or silicon nitride into a process zone, (ii) providing in the process zone, an energized process gas comprising oxygen to etch the dielectric layer on the substrate substantially without etching the patterned mask layer of silicon oxide or silicon nitride. Preferably, the process gas introduced into the process zone is substantially absent a fluorine-containing gas. More preferably, the process gas further comprises a non-reactive gas, such as nitrogen, argon, xenon, neon, krypton, or helium, in a volumetric flow ratio of oxygen to non-reactive gas sufficiently high to etch the dielectric layer at an etch rate at least about 500 nm/minute and an etching selectivity of the dielectric layer to the mask of at least about 15:1. Most preferably, the is directed to etching a silicon-containing organic dielectric layer having a dielectric constant of less than about 3.0. Suitable organic dielectric layers are composed of a polymer comprising one or more of benzocyclobutene, parylene, polytetrafluoroethylene, polyether, or polyimide.

In another aspect, the present invention is directed to a method suitable for forming interconnect plugs in a dielectric layer on a substrate. In this method, a substrate having a dielectric layer and an overlying first mask is placed in a process zone. Using the etching process of the present invention, first voids are formed in the dielectric layer. The first voids are then filled with a sacrificial material that is etched at the same or lower rate than the material of the dielectric layer. The dielectric layer is etched a second time to form second voids for the interconnect lines, which overlie the first voids formed for the vias. Thereafter, the sacrificial material is removed from the first voids by dipping the substrate in a stripper solution. Then the first and second voids are filled with metal in a single metallization step to form interconnect plugs and interconnecting lines.

DRAWINGS

These and other aspects, features and advantages of this invention will become better understood by the following drawings, description, and appended claims which illustrate the examples of this invention:

Figure 5A:
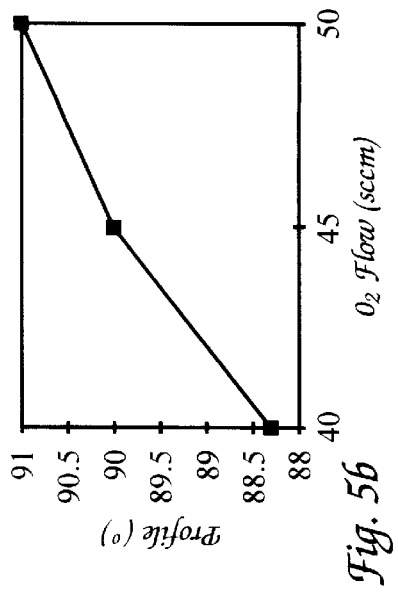
FIG. 5a is a graph showing the etch rate of the low K dielectric layer as a function of the volumetric flow rate of $O_2$.
Figure 5B:
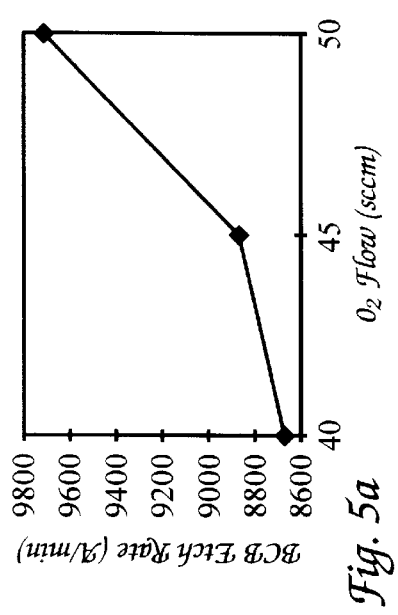
Figure 5C:
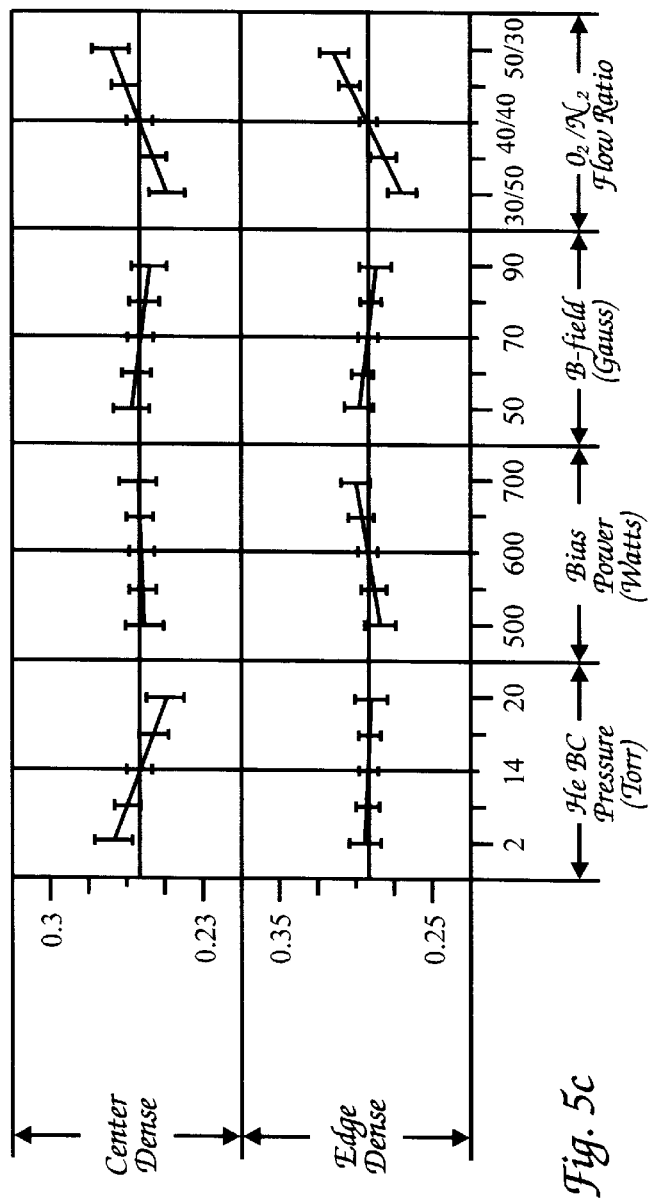

FIG. 5b is a graph showing the sidewall angle of features etched in the low K dielectric layer as a function of the volumetric flow rate of $O_2$; and FIG. 5c is a graph showing the etch rate and etch rate uniformity of the low K dielectric layer across the substrate when etching a 0.25 $\mu$m trench as a function of helium backside cooling, RF power, magnetic field strength, and the volumetric flow ratio of $O_2$ to $N_2$.

DESCRIPTION

The etching process of the present invention is useful for anisotropically etching a low K dielectric layer 10 on a substrate 15 with a high etch rate and a high etching selectivity ratio. The substrate 15 can be made of any material including glass, ceramic, metal, polymer, or semiconductor material, such as silicon or gallium arsenide. Preferably, the low K dielectric layer 10 comprises an organic polymer material having a low dielectric constant, such as benzocyclobutene, parylene, polytetrafluoroethylene, polyether, polyimide, or mixtures thereof. More preferably, the low K dielectric layer 10 comprises an organic polymer material having a low dielectric constant, and including small amounts of other materials to provide increased thermal stability and/or adhesion to a variety of metals and oxides. For example, a silicon-containing organic polymer material having a low dielectric constant, such as benzocyclobutene. By silicon-containing it is meant that the organic polymer material contains elemental silicon or silicon compounds, such as Si, $SiO_2$, or $Si_3N_4$.

Low K dielectric layers 10 comprising an organic polymer material are generally fabricated from high viscosity fluids consisting essentially of an organic polymer-precursor suspended in a solvent base. For example, CYCLOTENE® manufactured by Dow Chemical Company comprises the organic polymer benzocyclobutene, which has a dielectric constant of about 2.4 and is suspended in a solvent. The fluid polymer-precursor is applied on a substrate 15 using a conventional spin coating apparatus to form a low K dielectric layer 10 comprising an organic polymer. The thickness of the low K dielectric layer 10 is adjusted by varying the volume of polymer dispensed on the substrate 15, the speed at which the substrate 15 is spun, or the spinning time. The polymer layer on the substrate 15 is then cured in a vacuum oven and a low pressure and/or high temperature to evaporate the solvent carrier and cross-link the polymer.

An overlying layer of etch resistant material is deposited over the low K dielectric layer 10. Typically, the etch resistant layer comprises a hard mask layer 20 of silicon oxide, silicon nitride, silicon oxy-nitride, sputtered silicon, amorphous silicon, or amorphous carbon. The hard mask layer 20 is deposited directly over the low K dielectric layer 10 by any conventional means including plasma enhanced vapor deposition, chemical vapor deposition, and physical vapor deposition. In a preferred embodiment, the hard mask layer 20 comprises a layer of silicon dioxide deposited by CVD to a thickness of about 0.1–0.3 $\mu$m.

The hard mask layer 20 is patterned and etched to define the features to be etched in the low K dielectric layer 10 using conventional photolithographic processes. In conventional photolithographic processes, a photoresist, such as RISTON®, manufactured by duPont de Nemours Chemical Company, is applied on the hard mask layer 20, and the features to be etched, such as holes or voids for form vias, are defined by exposing the photoresist layer 25 to a pattern of light through a reticle corresponding to the desired configuration of features. The light exposed photoresist layer 25 is treated using a developer and the unexposed photoresist removed to uncover portions of the hard mask layer 20. Thereafter the hard mask layer 20 is etched using conventional etching processes, such as a plasma or energized process gas comprising a fluorine-containing gas, to expose portions of underlying low K dielectric layer 10.

Figure 1:
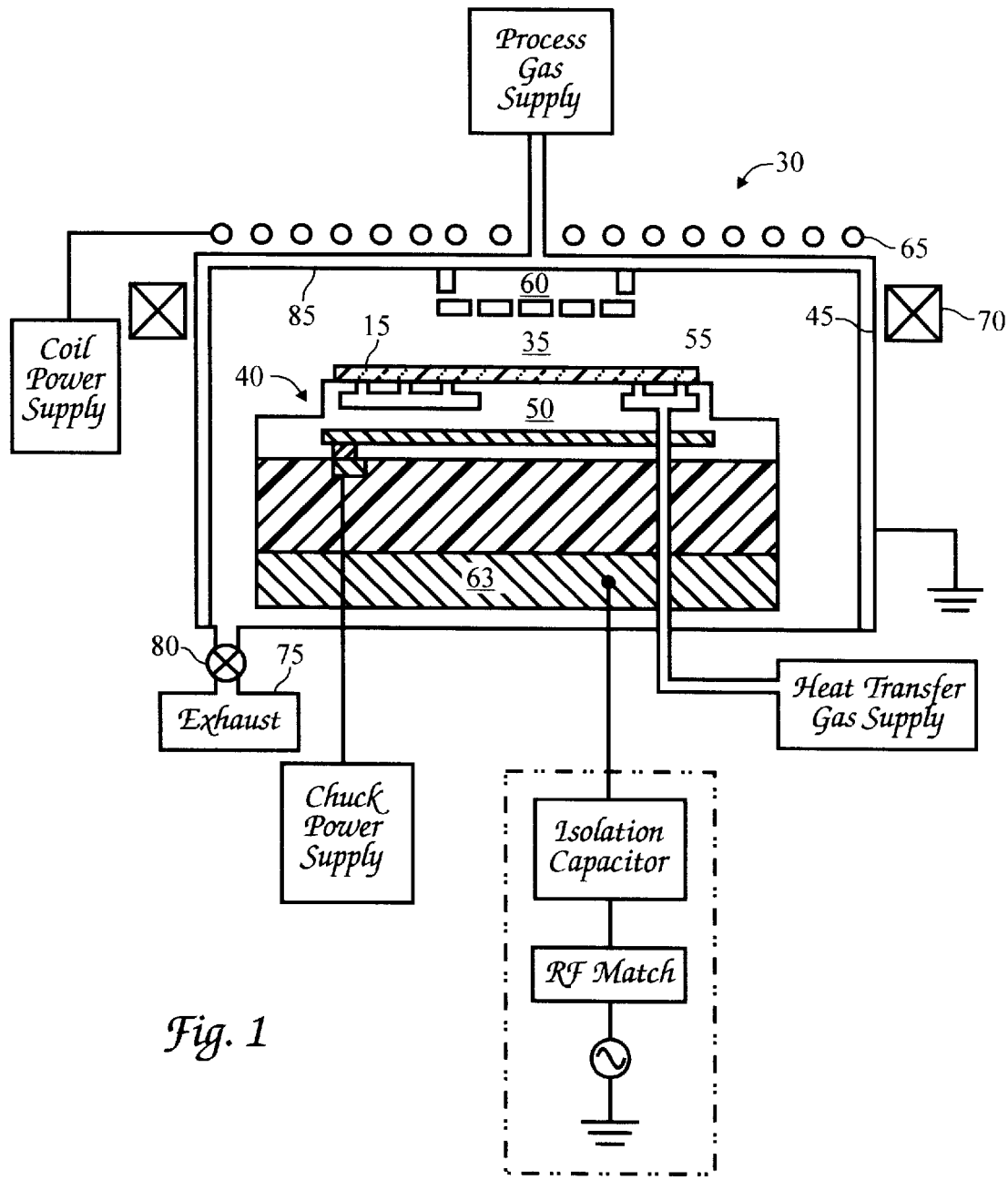
FIG. 1 is a schematic sectional view of a process chamber suitable for practicing the etching process of the present invention.

In the present process, the low K dielectric layer 10 on the substrate 15 is etched in a process chamber 30, such as for example, a DIELECTRIC ETCH MxP+ CENTURA chamber, commercially available from Applied Materials Inc., Santa Clara, Calif., as shown in FIG. 1. The particular embodiment of the process chamber 30 shown herein, suitable for processing of semiconductor substrates 15, is provided only to illustrate the invention, and should not be used to limit the scope of the invention. Other process chambers capable of energizing a process gas, for example an IPS chamber, also available from Applied Materials Inc., can also be used.

To perform the process, the process chamber 30 is evacuated to a pressure of less than about 1 mTorr, and a substrate 15 is transferred to a process zone 35 of the process chamber 30 from a load lock transfer chamber (not shown), that is also at vacuum. Preferably, the process zone 35 comprises a volume of at least about 5,000 cm$^3$, and more preferably from about 10,000 to about 50,000 cm$^3$. The substrate 15 is placed on a support 40 and held in place during the etching process using a mechanical or electrostatic chuck 50 having a receiving surface with grooves 55 in which a coolant gas, such as helium, is held to control the temperature of the substrate 15.

Process gas is introduced into the process chamber 30 through a gas distributor 60 peripherally disposed about the substrate 15, and the process chamber 30 is maintained at a pressure ranging from about 1 to about 1000 mTorr, and more typically from 10 to 300 mTorr. An electric field is coupled to the process gas in the process zone 35 to energize the process gas (i) inductively by applying an RF current to an inductor coil 65 encircling the process chamber 30, (ii) capacitively by applying an RF current to a cathode electrode 63 in the support 40 and sidewalls 45 of the process chamber 30 being electrically grounded to serve as an anode electrode, or (iii) both inductively and capacitively. In reactive ion etching (RIE) processes, the process gas is typically energized by capacitively coupling an RF voltage at a power level of from about 100 to about 2000 Watts to the cathode electrode 63, and by electrically grounding the anode electrode. Alternatively, an RF current at a power level of from about 750 Watts to about 2000 Watts can be applied to an inductor coil 65 to inductively couple energy into the process chamber 30 to energize the process gas in the process zone 35. The frequency of the RF current applied to the process electrodes or inductor coil 65 is typically from about 50 KHZ to about 60 MHZ, and more typically about 13.56 MHZ.

The plasma or energized process gas is enhanced using electron cyclotron resonance or magnetically enhanced reactors, in which a magnetic field generator, such as a permanent magnet 70 or electromagnetic coils, is used to apply a magnetic field to the plasma in the process zone 35 to increase the density and uniformity of the energized process gas. Preferably, the a magnetic field comprises a rotating magnetic field with the axis of the field rotating parallel to the plane of the substrate 15, as described in U.S. Pat. No. 4,842,683, issued Jun. 27, 1989, which is incorporated herein by reference. The magnetic field in the process chamber 30 should be sufficiently strong to increase the density of the ions formed in the energized process gas, and sufficiently uniform to reduce charge-up damage to features such as CMOS gates. Generally, the magnetic field as measured on a surface of the substrate 15 is less than about 500 Gauss, and more typically from about 10 to about 100 Gauss.

Spent process gas and etchant byproducts are exhausted from the process chamber 30 through an exhaust system 75 capable of achieving a minimum pressure of about 10$^{-3}$ mTorr in the process chamber 30. A throttle valve 80 is provided in the exhaust for controlling the pressure in the process chamber 30. Also, an optical endpoint measurement technique is typically used to determine completion of the etching process for a specific layer by measuring the change in light emission intensity of a particular wavelength corresponding to a detectable gaseous species. A sudden decrease or increase in the amount of the detectable species, such as for example, CO or CN, that results from chemical reaction of the process gas with the silicon dioxide or polysilicon layer indicates completion of etching of the dielectric layer and start of etching of the underlayer.

The etching process of the present invention uses a process gas that provides high etch rate and a high etching selectivity ratio of low K dielectric layer 10 comprising an organic polymer material. The process comprises the steps of placing a substrate 15 having a low K dielectric layer 10 with a patterned resist layer thereon into a process zone 35, introducing a process gas comprising oxygen into the process zone 35, and energizing the process gas in the process zone 35 to etch the polymer layer. Although the precise mechanism of the etching is unknown, it is believed the etching occurs primarily by the reaction of the oxygen gas with the hydrocarbon components of the organic polymer of the low K dielectric layer 10 to form gaseous carbon compounds, such as CO, CO$_2$, and other carbon-containing gases, that are exhausted from the process chamber 30.

The flow rate of the oxygen gas is dependent on the size of the process zone 35 and should be sufficiently high to react with substantially all the etchant residue on the substrate 15 to form gaseous byproducts. However, excessively high flow rates can isotropically etch the low K dielectric layer, which is undesirable. For a process zone 35 having a volume of about 10,000 cm$^3$, a suitable flow rate of oxygen gas is about 5–100 sccm, and more preferably about 10–40 sccm. For different sized process chambers 30, equivalent flow rates of oxygen that maintain substantially the same ratio of oxygen flow in sccm to process chamber 30 volume in cm$^3$ should be used.

Preferably, the process gas further comprises an inert gas that is activated by the energized process gas to sputter and remove dissociated material loosely adhered to the surface of the low K dielectric layer 10, thereby enhancing the dielectric etch rate. The inert gas can comprise argon, xenon, neon, krypton, or helium, of which helium is preferred. Because excessive amounts of inert gases can dilute the relative concentration of oxygen gas reducing the overall etch rate, the volumetric flow rate of inert gases to oxygen gas is tailored to provide optimum etch rates and etching selectivity ratios for a specific polymer. The content of the inert gas in the process gas is typically from about 5 to about 40 sccm.

For optimal etching, the volumetric flow ratio of oxygen to inert gas is selected to provide both a high etch rate and a high etching selectivity to the overlying hard mask layer 20 of SiO$_2$ or Si$_3$N$_4$ so as not to etch away the hard mask layer 20 before etching through the low K dielectric layer. Preferably, the volumetric flow ratio of oxygen to inert gas is selected to provide an etching layer selectivity ratio of etching the low K dielectric material relative to the hard mask layer 20 (and also relative to the underlayer) of at least about 15:1, while simultaneously etching the low K dielectric layer 10 at a high etch rate of at least about 0.5 μm/min, and more preferably from 0.7 to 1.5 μm/min. Preferably, the volumetric flow ratio of oxygen to the other gas is from about 1:0 to about 0:1, for example from about 2:1 to about 1:2, and more preferably from 2:1 to 1:0, and most preferably about 1:1. For example, when the substrate 15 comprises an underlayer below the low K dielectric layer 10, such as a poly or monocrystalline silicon, metallic silicide, silicon oxide, or silicon nitride layer, the volumetric flow ratio of oxygen to an inert gas can be tailored to increase etching selectivity ratios for specific combinations of materials, such as for example, the etching of benzocyclobutene to a silicon substrate 15. In particular, the volumetric flow ratio of the process gas is selected so that the etching selectivity ratio of dielectric to silicon substrate 15 is at least about 5:1, and more preferably at least about 15:1. The volumetric flow ratio of oxygen to an inert gas can also be adjusted so that the etch rate of the low K dielectric layer 10 is at least 10, while sidewalls 90 of the etched features have smooth surfaces that form angles of at least about 85° with the surface of the low K dielectric layer 10 on the substrate 15. Although preferred volumetric flow ratios are recited herein, it should be understood that the volumetric flow ratios can be tailored for different combinations of materials, and feature geometry, such as feature aspect ratios, to achieve specific etching selectivity ratios or etch rates without deviation of the present invention.

In another embodiment of this invention, it has been found that the addition of passivating gases in combination with oxygen and an inert gas provides passivating films on the sidewalls 90 of freshly etched features thereby promoting anisotropic etching. It is believed, that the added passivating gases react with dissociated carbon atoms to form polymers that deposit on the sidewalls 90 of the freshly etched features as passivating films that improve vertical anisotropic etching. Suitable gases include N$_2$, H$_2$, NH$_3$, CO, or mixtures thereof, of which N$_2$ is preferred. Preferably, the volumetric flow ratio of oxygen, inert gas, and passivating gas is from about 1:5:5 to about 1:0:0, for example from about 2:1:1 to about 1:4:4, and more preferably from about 1:1:1 to about 1:0:5, and most preferably from about 1:0:1 to about 1:0:5.

Figure 2:
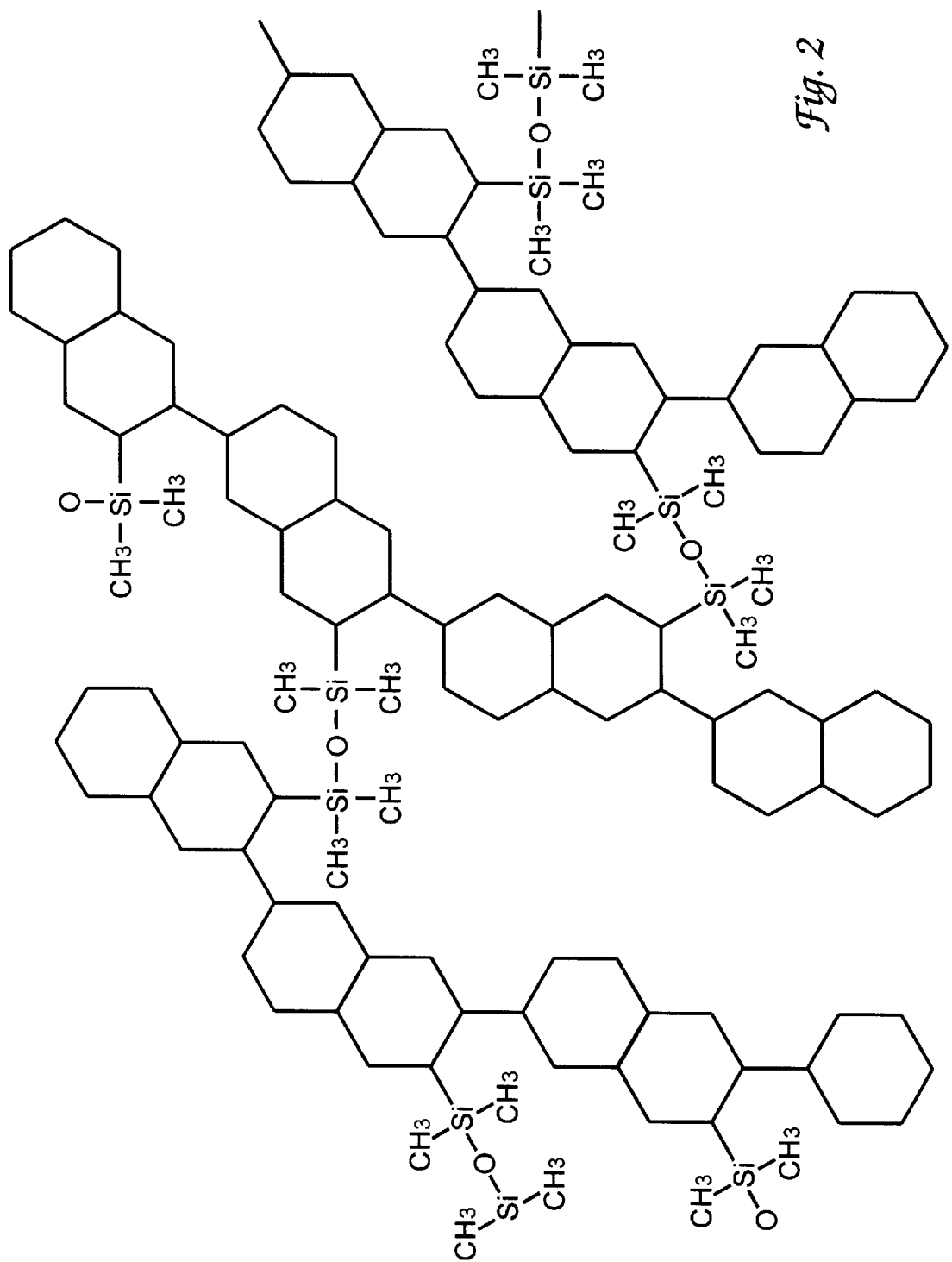
FIG. 2 is a schematic of a partial molecule of benzocyclobutene.

A further advantage of the process gas is that the oxygen-containing gas removes or strips any photoresist, etchant byproducts, and excessive passivating deposits remaining on the substrate 15 while simultaneously etching the low K dielectric layer 10, especially at low etching temperatures. Thus, when the etching of the low K dielectric layer 10 is completed, a post-process of stripping photoresist can proceed immediately without interrupting the manufacturing process. However, in contrast to conventional resist stripping processes that require the substrate 15 to be heated to temperatures of from about 200 to about 400° C. in order to burn off the resist, the process of the present invention removes the low K dielectric layer by etching at low temperatures. FIG. 2 shows a schematic of a partial molecule of benzocyclobutene, showing the SI—O linkages and the hydrocarbon groups. It has been discovered that the reaction between the oxygen-containing gas and hydrocarbon groups of the organic polymer of the low K dielectric layer 10 is exothermic, and the etching rate of the low K dielectric is actually improved by lowering the temperature of the substrate 15. Preferably, the substrate 15 is cooled using helium as described above to a temperature of less than about 40° C. More preferably, the substrate 15 is cooled to a temperature of at least about −30° C.

In yet another aspect, the present invention is to a method for forming multiple levels of interconnecting lines 95, and vias 100 in low K dielectric layers 10 by a dual damascene process. In this method, illustrated in FIGS. 3a to 3d, a low K dielectric layer 10 having a thickness of from about 0.5 to about 5 μm, is deposited over interconnecting lines 95 of conducting material on an underlying layer 105 on the substrate 15. A patterned hard mask layer 20 of silicon oxide or nitride is formed over the low K dielectric layer 10. Thereafter, the process of the present invention is used to etch first voids 110 in the low K dielectric layer 10 for fabricating vias 100 that connect the different levels of interconnecting lines 95 to one another.

The first voids 110 etched in the dielectric layer are filled with a sacrificial material 115 that is resistant to the patterning processes used to pattern and etch through the hard mask layer 20, and that is etched at the same or lower rate than the rate of etching of the organic polymer low K dielectric layer 10 by the present process. A second layer of hard mask 20 is formed over the surfaces of the filled voids and the low K dielectric layer 10, and the hard mask layer 20 is patterned to provide a layer of another set of resist features on the substrate 15.

Figure 3A:
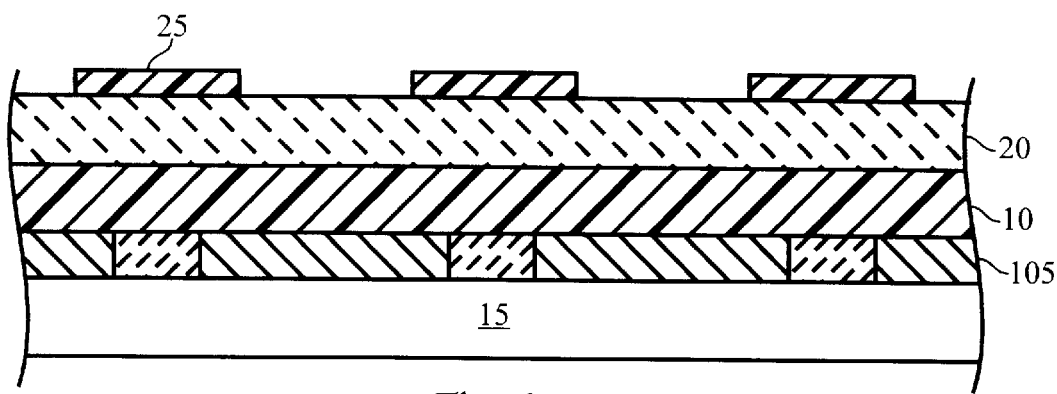
FIG. 3a is a schematic in vertical cross-section of a patterned photoresist layer and hard mask layer over a low K dielectric layer covering electrically conductive interconnect lines on a substrate.
Figure 3B:
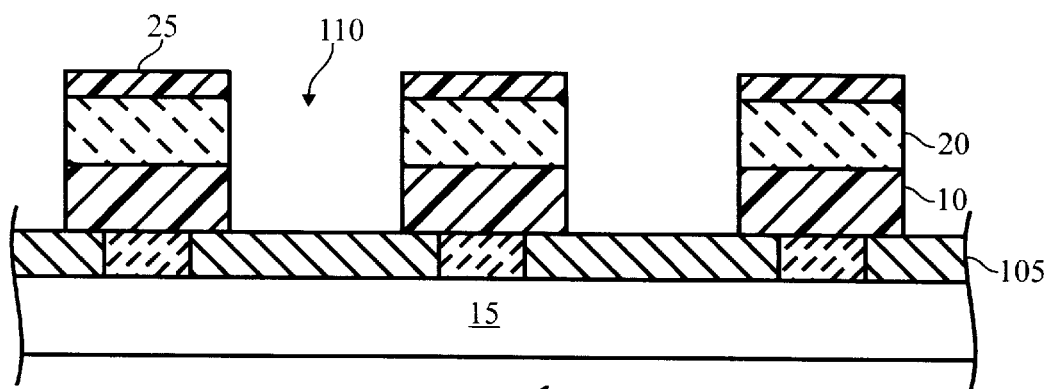
FIG. 3b is a schematic in vertical cross-section of the substrate of FIG. 3a after etching of the low K dielectric layer showing a substantially anisotropically etched first void for forming a via.
Figure 3C:
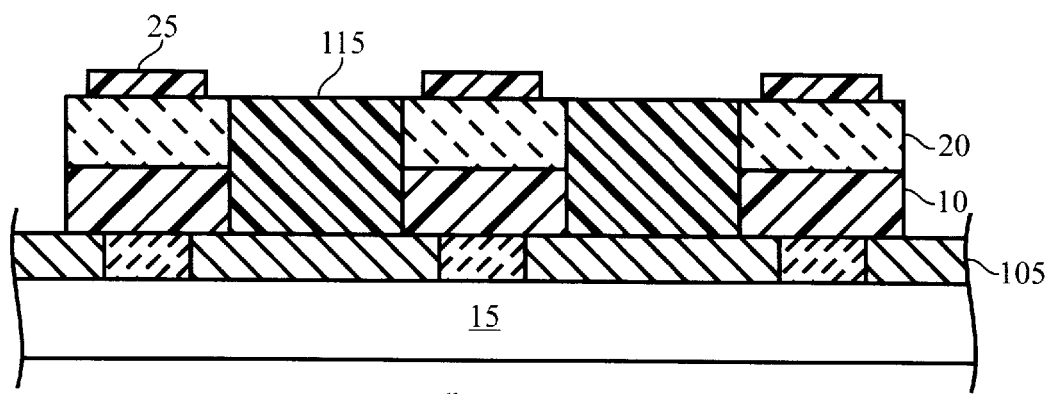
FIG. 3c is a schematic in vertical cross-section of the substrate of FIG. 3b showing a patterned photoresist layer for forming a second void over the first void, and showing the first void filled with a sacrificial material.
Figure 3D:
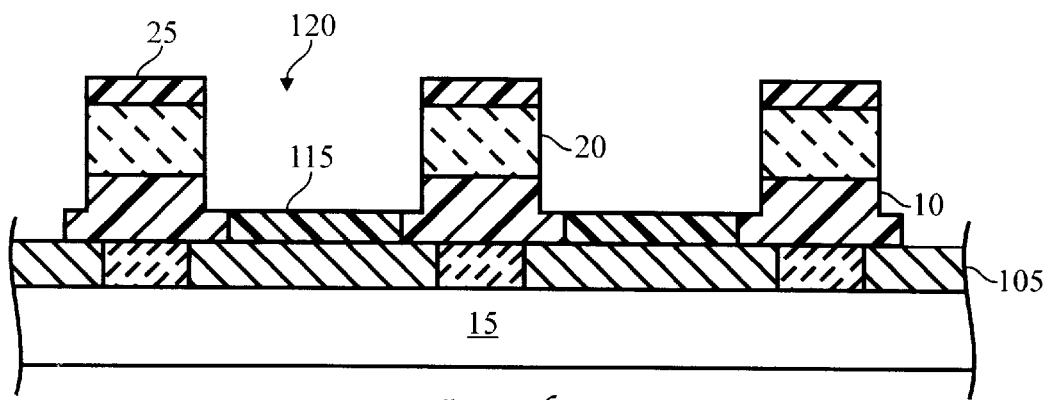
FIG. 3d is a schematic in vertical cross-section of the substrate of FIG. 3c after etching of the low K dielectric layer showing a substantially anisotropically etched second void for forming an interconnect line.
Figure 3E:
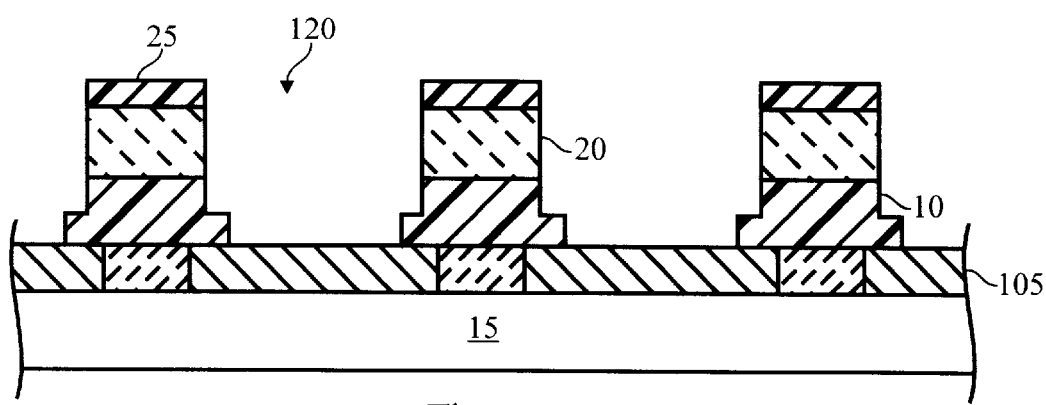
FIG. 3e is a schematic in vertical cross-section of the substrate of FIG. 3d after removing remnant sacrificial material.
Figure 3F:
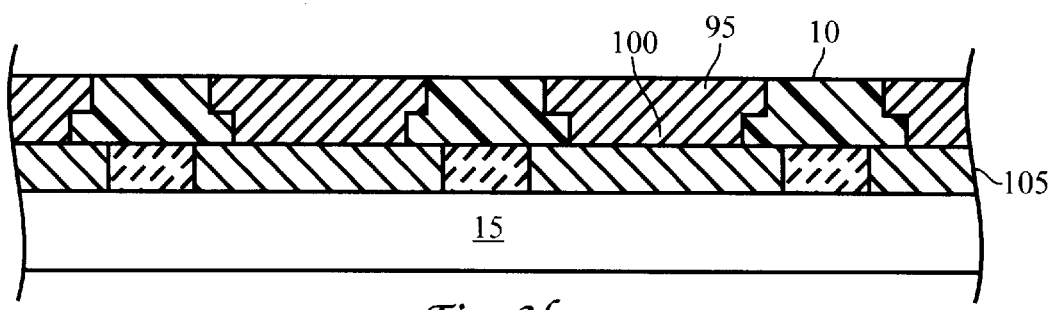
FIG. 3f is a schematic in vertical cross-section of the substrate of FIG. 3e after filling first and second voids with metal to form vias and interconnect lines.

The low K dielectric layer 10 is etched for a second time by the present etching process to form second voids 120 in the low K dielectric layer 10, the second voids 120 sized and distributed to form second interconnect lines, which overlie the first voids 110 formed for the interconnecting vias 100. Thereafter, the sacrificial material 115 is removed from the first voids 110 by a wet etching process that removes any remaining sacrificial material 115 substantially without etching or damaging the surrounding low K dielectric layer 10. The first and second voids 120 are filled with metal in a single metallization step to form interconnect plugs and overlying interconnecting lines 95, as shown in FIG. 3d.

One problem of performing the dual damascene process for etching low K dielectric polymer layer, is that the sacrificial material 115 in the first voids 110 should not be removed by any of the subsequent processes that are used to form the second voids 120. At the same time, the sacrificial material 115 must be capable of being readily removed by a process that does not damage or etch the surrounding low K dielectric layer 10. Preferably, the sacrificial material 115 is a photoresist that consists essentially of an organic polymer that is etched at approximately the same or lower rate as the low K dielectric layer 10. More preferably, the photoresist used as the sacrificial material 115 is not removed by the etching process used to etch the second voids 120 for forming the second interconnecting lines 95. This can be accomplished by using a photoresist that is opposite to the photoresist type used to pattern the hard mask layer 20. For example, when a positive-resist such as RISTON® is used to pattern the hard mask layer 20, a negative resist is used for the sacrificial material 115. Another method is to select a photoresist that is sensitive to different frequencies of light, so that photoresist used as a sacrificial material 115 is not altered by exposure to the light used to pattern the hard mask layer 20. A third way is to use a reticle that exposes or masks the sacrificial material 115 in the first voids 110 as it simultaneously defines the second voids 120 in a photoresist layer 25 on the hard mask layer 20. A suitable photoresist, which is not exposed by the same frequency of light as RISTON®.

The present invention has been discovered to provide a method for removing a suitable sacrificial material 115 from a silicon-containing low K dielectric layer 10, such as benzocyclobutene, substantially without damaging or etching the surrounding low K dielectric layer 10. In the method, after the second voids 120 have been formed in the hard mask layer 20, the substrate 15 is immersed in a bath of a stripping solution, which removes the sacrificial material without reacting with the low K dielectric material. A suitable stripping solution comprises EKC®, commercially available from Shippley Corporation of Newton, Mass. The substrate is immersed in the bath from about 5 seconds to 1 hour. In addition, methods that employ additional energy imparted to the bath, such as ultrasonic baths or elevated temperatures can also be used. Following the wet etching step, the etching solution that remains on the substrate 15 surface is neutralized and removed by a suitable rinsing apparatus. Suitable rinsing apparatus include a cascade overflow rinsing tank, a quick down rinser, or a spin rinse/dryer.

EXAMPLES

The following examples illustrate the process of the present invention for etching low K dielectric layers 10 comprising organic polymers, especially silicon-containing low K dielectric layers, on semiconductor substrates 15. However, the apparatus and method can be used in other applications as would be apparent to those skilled in the art, and the scope of the present invention should not be limited to the illustrative examples provided herein.

In these examples, the substrates 15 were silicon wafers of 200 mm (8 inch) diameter, coated successively with a benzocyclobutene layer having a thickness of about 2 $\mu$m, and a silicon oxide hard mask layer 20 having a thickness of about 0.3 $\mu$m. In addition there was a layer of photoresist, typically about 1 $\mu$m thick, on the hard mask layer 20. The substrate 15 was placed on the support 40 of a DIELECTRIC ETCH MxP+ CENTURA chamber. Process gas comprising $O_2$ and $N_2$ in the particular volumetric flow rates and volumetric flow ratios described below were introduced into the process chamber 30 and the process chamber 30 was maintained at a pressure of about 30 mTorr. Thereafter, the process gas was energized in the process zone 35 by applying a RF voltage to the process electrodes, and the energized process gas was enhanced by applying a rotating magnetic field within the process zone 35. The particular power level applied to the process electrodes and the strength of the magnetic field are described for each example. The substrate 15 was cooled to temperatures sufficiently low to provide a high etching rate of the low K dielectric layer 10. Typically, the substrate 15 was cooled to a temperature of 2° C. using a flow of helium on the backside of the substrate 15 maintained at a pressure of from about 2 to about 20 Torr.

Scanning electron microscope (SEM) photos or micrographs of the etched wafers were used to measure (i) the material removed from the low K dielectric layer 10, (ii) the material removed from the overlying $SiO_2$ hard mask layer 20, and (iii) the sidewall profile angle. The mean etch rate was calculated by measuring the depth of the features etched in the substrate 15 in at least 15 different places. The etching selectivity ratio was calculated from the ratio of the etch rate of the low K dielectric layer 10 to the etch rate of the hard mask layer 20. The etch rate uniformity was calculated using the formula:

Uniformity=(maximum etch rate−minimum etch rate)/(2 mean etch rate)

Example 1

Figure 4:
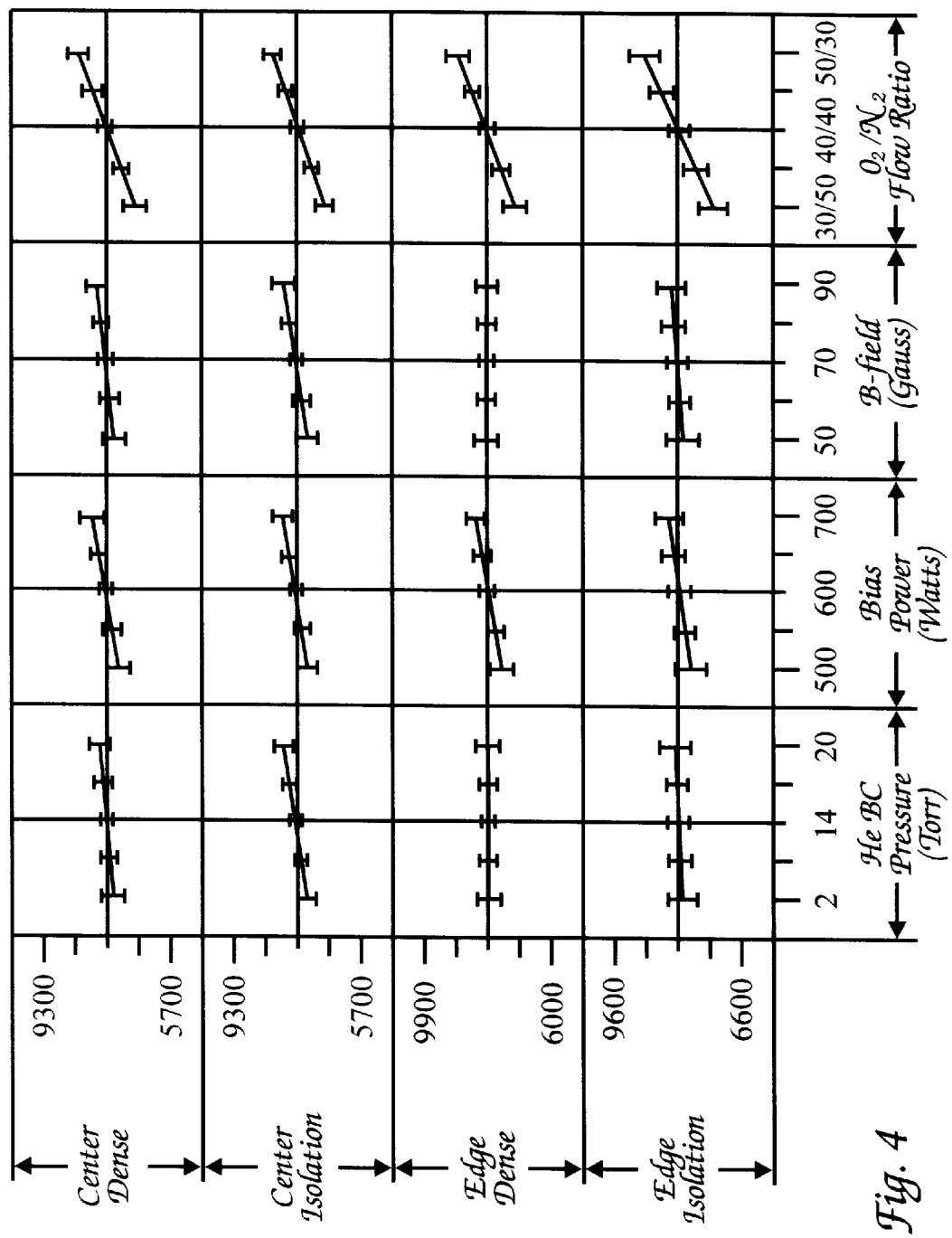
FIG. 4 is a graph showing the change in the etch rate and etch rate uniformity of the low K dielectric layer across a substrate when etching vias and interconnect lines as a function of helium backside cooling, RF power, magnetic field strength, and the volumetric flow ratio of $O_2$ to $N_2$.

In a first example, a series of experiments were conducted to study the effect of substrate temperature, RF power, magnetic field strength, and the volumetric flow ratio of $O_2$ to $N_2$, on the mean etch rate for etching vias 100 in the low K dielectric layer 10. The results are shown in FIG. 4, in which the vertical axis is divided into four parts to indicate four different regions on each substrate 15 at which etch rates were measured, including a substrate edge having a low density of etched features or active devices (isolation region), a substrate edge having a high density region, a substrate center having a low density region, and a substrate center having a high density region. The etch rates shown in graph are mean etch rates calculated for measurements made on 19 substrates. The mean etch rate for the edge isolation region was 7952 Å/min, the mean etch rate for the edge dense region was 8046, and the mean etch rate for the center dense and isolation region were 7340 and 7350, respectively. The horizontal axis of FIG. 4 is also divided into four parts, which show the pressure in Torr of helium applied to the backside of the substrates for maintaining the substrate at desired temperature levels, the power level applied to the process electrodes, the strength of the magnetic field, and the volumetric flow ratio of $O_2$ to $N_2$ for a total flow rate of process gas of 80 sccm.

Referring to FIG. 4, it is seen that with few exceptions, the etch rates in all four measured regions of the substrates 15 increased with increasing helium pressure, RF power, magnetic field strength, and volumetric flow ratio of $O_2$ to $N_2$. Because the oxygen containing gas is predominantly responsible for etching the low K dielectric layer 10, the etch rate is seen to increase most rapidly for increasing volumetric flow ratios of $O_2$ to $N_2$.

The low K dielectric etch rate also rises for increasing helium pressure or increased cooling of the substrate 15, because of the exothermic nature of the etching reaction between the process gas and the low K dielectric layer 10. However, the low K dielectric etch rate does not rise with helium pressure in the region near the edge of the substrate 15 which is dense with active devices because of two reasons. First, helium escapes from the grooves 55 below the substrate 15 by flowing past the edge of the substrate 15, causing more cooling at the edge of the substrate. Second, there are more active devices in this region so less material is etched, excess heat has to be removed, and therefore there is less of an effect on the etch rate. The nearly constant etch rate in this region for an increasing magnetic field strength is also attributed to the same factors, for example, because there is less low K dielectric material to be removed, increasing magnetic field strength to increase the stirring and concentration of the energized process gas ions above the substrate has little or no effect on the dielectric etch rate.

Example 2

Example 2 illustrates the variation in etch rate and sidewall profile of the etched features, as a function of increasing volumetric flow rate of $O_2$ as shown in FIGS. 5a and 5b, respectively. In these experiments, the volumetric flow rate of $O_2$ was increased from 40 to 50 sccm, and the volumetric flow ratio of $O_2$ to $N_2$ was held constant at 1:1. The power level applied to the process electrodes was 600 Watts, the magnetic field measured at the wafer surface was 90 Gauss. The substrates 15 were maintained at a temperature of 2° C. by helium at pressure of 14 Torr It is seen from FIG. 5a that the etch rate of the low K dielectric layer 10 increases proportionally with increasing volumetric flow rates of $O_2$, and increases at a faster rate when the oxygen flow rate exceeds 45 sccm. Referring to FIG. 5b, it is seen the angle of the sidewall profile increases with increasing volumetric flow rates of $O_2$, with a preferred profile of 90° at about 45 sccm. Note that for FIG. 5b, the sidewall profile angle was measured from the substrate surface below the low K dielectric layer 10 so that angles greater than 90° indicate bowing of the sidewalls. By bowing it is meant that the cross-sectional area of the etched features increases from the top to the bottom of the etched features.

Example 3

Example 3 illustrates a factorial design study that was conducted for studying the effect of four variables each operated at three levels, on the loss of critical dimensions (CD), in the etching of a dielectric layer. The four variables included helium backside cooling pressure, power applied to the plasma generator, magnetic field strength, and the volumetric flow ratio of $O_2$ to $N_2$. As shown in Table I, the volumetric flow ratios of oxygen to nitrogen were from about 0.6:1 to about 1:0.6.

TABLE I

| | Factors | | | |
|---|---|---|---|---|
| Level | He Pressure (Torr) | Bias Power (Watts) | B-field Gauss | $O_2/N_2$ Ratio |
| High (+) | 20 | 700 | 90 | 50:30 |
| Center (0) | 14 | 600 | 70 | 40:40 |
| Low (−) | 8 | 500 | 50 | 30:50 |

In these experiments, trenches having a critical dimension of 0.25 µm were etched in the low K dielectric layer 10. The loss in critical dimension of the features etched in the low K dielectric layer 10 was measured at 2 different regions across the surface of the substrates 15. SEM micrographs were used to measure the average width ($W_r$) of the mask or resist features formed on the low K dielectric layer prior to etching. After etching, a second width ($W_e$) of the etched features was measured. The critical dimension loss was the difference $W_r-W_e$, and the % critical dimension loss was $(W_r-W_e)/W_r \times 100\%$. The minimum critical dimension was measured as an average value of the smallest width across the cross-sections of the etched features.

The loss in CD results are shown in the graph of FIG. 5c, in which the vertical axis is divided into two parts each of which corresponds to a particular region on the substrates 15, on which etch rate measurements were made. The two regions consist of an edge region at an edge of the substrate 15 that had a high density of active devices and etched features, and a central region at a center of the substrates 15 that had a low density of active devices or etched features. The horizontal axis of FIG. 5c is divided into four parts, and shows the helium gas pressure in Torr applied to the backside of the substrates 15, the power level applied to the process electrodes, the strength of the magnetic field, and the volumetric flow ratio Of $O_2$ to $N_2$.

From FIG. 5c, it is seen that the loss in critical dimension of the etched features at both the center and edge regions of the substrates 15 change in the same direction for increasing helium pressure, RF power, magnetic field strength, and volumetric flow ratio Of $O_2$ to $N_2$. The mean critical dimensions of the 0.25 µm trench was 0.25 and 0.28 in the center dense region and edge dense regions, respectively. Thus the general effect of these four variables on the loss of critical dimension at different points on the surface substrate 15 is the same. However, for increasing helium gas pressure, the magnitude of the loss in critical dimension is much larger for the central regions of the substrate 15. In addition, the loss in critical dimensions decreases substantially for increasing flow ratios of oxygen to nitrogen, which is unexpected because additional oxygen content would be expected to result in faster and more isotropic etching, especially because the oxygen burns up polymeric passivating deposits that provide anisotropic etching. The loss in CD also decreases, but at a slower rate, for increasing bias power level which is expected because higher bias power provides more energetic ions that etch in more highly directionally in the vertical direction.

These examples demonstrate that a process according to the present invention provides high etch rates that are greater than 0.8 µm/minute, and a high etching selectivity ratio of etching the silicon-containing low K dielectric layer 10 to the overlying hard mask layer 20 that is greater than 15:1. The profiles of the features etched in the low K dielectric layer 10 had substantially vertical angles relative to the plane of the substrate 15 that often exceeding 85°. Also, a low loss in critical dimensions was obtained for etching the dielectric layer. Furthermore, the absence of fluorine species improved yields due to an absence in contamination of the dielectric layer by the halogen ions and species.

Although the present invention has been described in considerable detail with regard to the preferred versions thereof, other versions are possible. For example, non-fluorine containing gases that are equivalent in function to the oxygen gas or inert gas, can also be used, and the etching process can be used to etch other layers or structures comprising organic polymer materials having a low dielectric constant, such as passivation layers and stress reducing layers. Therefore, the appended claims should not be limited to the description of the preferred versions contained herein.

What is claimed is:

1. An etching process for etching a dielectric layer on a substrate, the etching process comprising the steps of:
   (a) placing the substrate in a process zone, the substrate comprising a dielectric layer having an overlying mask, the dielectric layer comprising a dielectric constant of less than about 3.2;
   (b) providing in the process zone, an energized process gas comprising oxygen and non-reactive gas to etch the dielectric layer on the substrate; and
   (c) maintaining the substrate at a temperature of less than about 40° C.

2. A process according to claim 1 wherein step (a) comprises the step of placing a substrate comprising a dielectric layer comprising organic dielectric material having a dielectric constant of less than about 3 in the process zone.

3. A process according to claim 1 wherein in (c) the substrate is maintained at a temperature of at least about −30° C.

4. A process according to claim 1 wherein the energized process gas is substantially absent fluorine-containing gas.

5. A process according to claim 1 wherein the non-reactive gas comprises one or more of nitrogen, argon, xenon, neon, krypton, and helium.

6. A process according to claim 5 wherein the energized process gas comprises oxygen and nitrogen in a volumetric flow ratio of about 1:2 to about 2:1.

7. A process according to claim 1 wherein the energized process gas further comprises a passivating gas selected from the group consisting of CO, $CO_2$, $NH_3$, and $H_2$.

8. A process according to claim 1 wherein the energized process gas comprises oxygen, $N_2$, and CO, in a volumetric flow ratio of from about 2:1:1 to about 1:4:4.

9. A process according to claim 1 wherein step (a) comprises the step of placing a substrate comprising a silicon-containing dielectric layer comprising benzocyclobutene polymer.

10. An etching process for etching an organic dielectric layer on a substrate, the etching process comprising the steps of:
    (a) placing the substrate in a process zone, the substrate comprising an organic dielectric layer comprising a dielectric constant of less than about 3.2 and the organic dielectric layer having an overlying mask; and
    (b) providing in the process zone, an energized process gas comprising reactive gas and non-reactive gas, wherein the reactive gas comprises oxygen and the non-reactive gas comprises one or more of nitrogen, argon, xenon, neon, krypton, or helium,
    the process gas comprising a volumetric flow ratio of reactive gas to non-reactive gas that is sufficiently high to etch the dielectric layer at an etch rate of at least about 500 nm/min.

11. A process according to claim 10 wherein the process gas comprises oxygen and nitrogen in a volumetric flow ratio of about 1:2 to about 2:1.

12. A process according to claim 10 wherein the substrate is maintained at a temperature of less than about 40° C.

13. A process according to claim 10 wherein the process gas further comprises a passivating gas comprising one or more of CO, $CO_2$, $NH_3$, and $H_2$.

14. A process according to claim 13 wherein the process gas comprises oxygen, nitrogen, and CO in a volumetric flow ratio of from about 2:1:1 to about 1:4:4.

15. An etching process for etching a substrate, the etching process comprising the steps of:
    (a) placing the substrate in a process zone, the substrate comprising a dielectric layer having a dielectric constant less than about 3.2 and an overlying mask;
    (b) providing in the process zone, an energized process gas comprising oxygen and non-reactive gas comprising one or more of nitrogen, argon, xenon, neon, krypton, and helium to etch the dielectric layer; and
    (c) maintaining the substrate at a temperature of less than about 40° C.

16. A process according to claim 15 wherein step (a) comprises the step of placing a substrate comprising a dielectric layer comprising benzocyclobutene.

17. A process according to claim 15 wherein the volumetric flow ratio of oxygen to non-reactive gas is sufficiently high to etch the dielectric layer at an etch rate of at least about 500 nm/minute with an etching selectivity of at least about 15:1 to an overlying mask comprising silicon oxide or silicon nitride.

18. A process according to claim 15 wherein the process gas is substantially absent a fluorine-containing gas.

19. A process according to claim 15 wherein the process gas comprises oxygen and nitrogen in a volumetric flow ratio of about 1:2 to about 2:1.

20. A process according to claim 15 wherein in (c) the substrate is maintained at a temperature of at least about −30° C.

21. A process according to claim 15 wherein the process gas further comprises a passivating gas selected from the group consisting of CO, $CO_2$, $NH_3$, and $H_2$.

22. A process according to claim 21 wherein the process gas comprises oxygen, nitrogen, and CO, in a volumetric flow ratio of from about 2:1:1 to about 1:4:4.

23. A process according to claim 5 wherein the volumetric flow ratio of oxygen to the non-reactive gas is sufficiently high to etch the dielectric layer at an etch rate of at least about 500 nm/minute with an etching selectivity of at least about 15:1 to an overlying mask comprising silicon oxide or silicon nitride.

24. A process according to claim 10 wherein the volumetric flow ratio of oxygen to the non-reactive gas is sufficiently high to provide an etching selectivity of at least about 15:1 to an overlying mask comprising silicon oxide or silicon nitride.

25. A process according to claim 15 wherein the dielectric layer comprises one or more of benzocyclobutene polymer, parylene, polytetrafluoroethylene, polyether, or polyimide.

26. An etching process for etching a dielectric layer on a substrate, the etching process comprising the steps of:
    (a) placing the substrate in a process zone, the substrate comprising a dielectric layer having an overlying mask; and
    (b) providing in the process zone, an energized process gas comprising reactive gas and non-reactive gas at a volumetric flow ratio of reactive to non-reactive gas that is sufficiently high to etch the dielectric layer at an etch rate of at least about 500 nm/minute.

27. A process according to claim 26 wherein step (a) comprises the step of placing a substrate comprising a dielectric layer having a dielectric constant of less than about 3.2 in the process zone.

28. A process according to claim 26 wherein step (a) comprises the step of placing a substrate comprising a dielectric layer comprising organic dielectric material in the process zone.

29. A process according to claim 26 wherein step (a) comprises the step of placing a substrate comprising a dielectric layer comprising benzocyclobutene polymer in the process zone.

30. A process according to claim 26 wherein the energized process gas comprises non-reactive gas comprising one or more of nitrogen, argon, xenon, neon, krypton, and helium.

31. A process according to claim 26 wherein the volumetric flow ratio of reactive to non-reactive gas is sufficiently high to etch the dielectric layer at an etch rate of at least about 500 nm/minute with an etching selectivity of at least about 15:1 to an overlying mask comprising silicon oxide or silicon nitride.

32. A process according to claim 26 wherein the energized process gas further comprises a passivating gas selected from the group consisting of CO, $CO_2$, $NH_3$, and $H_2$.

33. A process according to claim 26 wherein the energized process gas comprises oxygen, $N_2$, and CO, in a volumetric flow ratio of from about 2:1:1 to about 1:4:4.

34. An etching process for etching a dielectric layer on a substrate, the etching process comprising the steps of:
  (a) placing the substrate in a process zone, the substrate comprising a dielectric layer having an overlying mask; and
  (b) providing in the process zone, an energized process gas comprising oxygen and nitrogen at a volumetric flow ratio of oxygen to nitrogen that is sufficiently high to etch the dielectric layer on the substrate at an etch rate of at least about 500 nm/minute.

35. A process according to claim 34 wherein step (b) comprises providing an energized process gas comprising oxygen and nitrogen in a volumetric flow ratio of oxygen to nitrogen of about 0.6:1 to about 1:0.6.

36. A process according to claim 34 wherein step (a) comprises the step of placing a substrate comprising a silicon-containing dielectric layer in the process zone.

37. A process according to claim 34 wherein step (a) comprises the step of placing a substrate comprising a dielectric layer comprising organic dielectric material in the process zone.

38. A process according to claim 34 wherein step (a) comprises the step of placing a substrate comprising a dielectric layer comprising benzocyclobutene polymer in the process zone.

39. A process according to claim 34 wherein the energized process gas further comprises one or more of argon, xenon, neon, krypton, and helium.

40. A process according to claim 34 wherein the energized process gas further comprises a passivating gas selected from the group consisting of CO, $CO_2$, $NH_3$, and $H_2$.

41. A process according to claim 1 wherein the non-reactive gas is substantially absent fluorine-containing gas.

42. A process according to claim 15 wherein the non-reactive gas is substantially absent fluorine-containing gas.

43. A process according to claim 34 wherein the volumetric flow ratio of oxygen to nitrogen is from about 1:2 to about 2:1.

44. A process according to claim 34 wherein step (a) comprises the step of placing a substrate comprising a dielectric layer having a dielectric constant less than about 3.2 in the process zone.

45. An etching process for etching a dielectric layer on a substrate, the etching process comprising the steps of:
  (a) placing the substrate in a process zone, the substrate comprising a dielectric layer having an overlying mask, the dielectric layer comprising a dielectric constant of less than about 3.2;
  (b) providing in the process zone, an energized process gas to etch the dielectric layer on the substrate, the energized process gas comprising (i) oxygen, (ii) a non-reactive gas, and (iii) a passivating gas comprising one or more of CO, $CO_2$, $NH_3$ and $H_2$; and
  (c) maintaing the substrate at a temperature of less than about 40° C.

46. A process according to claim 45 wherein in (c) the substrate is maintained at a temperature of at least about -30° C.

47. A process according to claim 45 wherein (a) comprises the step of placing a substrate comprising a dielectric layer comprising organic dielectric material having a dielectric constant of less than about 3, in the process zone.

48. A process according to claim 45 wherein the energized process gas is substantially absent fluorine-containing gas.

49. A process according to claim 45 wherein the non-reactive gas comprises one or more of nitrogen, argon, xenon, neon, krypton, and helium.

50. A process according to claim 49 wherein the energized process gas comprises oxygen and nitrogen in a volumetric flow ratio of about 1:2 to about 2:1.

51. A process according to claim 45 wherein the energized process gas comprises oxygen, $N_2$, and CO, in a volumetric flow ratio of from about 2:1:1 to about 1:4:4.

52. A process according to claim 45 wherein (a) comprises the step of placing a substrate comprising a silicon-containing dielectric layer comprising benzocyclobutene polymer in the process zone.

* * * * *